(12) United States Patent
Corr

(10) Patent No.: US 6,946,846 B2
(45) Date of Patent: Sep. 20, 2005

(54) CIRCUIT FOR MEASURING ON-CHIP POWER SUPPLY INTEGRITY

(75) Inventor: William E. Corr, Twickenham (GB)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/911,575

(22) Filed: Aug. 5, 2004

(65) Prior Publication Data

US 2005/0007126 A1 Jan. 13, 2005

Related U.S. Application Data

(62) Division of application No. 09/808,140, filed on Mar. 15, 2001.

(30) Foreign Application Priority Data

Mar. 14, 2001 (GB) .............................................. 0106296

(51) Int. Cl.$^7$ ........................ G01R 31/02; G01R 31/36; G01R 31/26
(52) U.S. Cl. ........................ 324/537; 324/522; 324/771; 324/765
(58) Field of Search .............................. 324/522, 678, 324/426–428, 763, 765, 658, 771, 537; 713/300; 716/4, 5

(56) References Cited

U.S. PATENT DOCUMENTS 4,278,971 A * 7/1981 Yasui et al. ................. 340/635
4,807,277 A    2/1989 Perry
5,045,835 A    9/1991 Masegi et al.
2002/0125897 A1 * 9/2002 Frech et al. ................. 324/658

FOREIGN PATENT DOCUMENTS

JP    2-264874    10/1990
JP    7-239369    9/1995

* cited by examiner

Primary Examiner—Anjan Deb
(74) Attorney, Agent, or Firm—Dickstein Shapiro Morin & Oshinsky LLP

(57) ABSTRACT

A test circuit and method for measuring power supply integrity is provided. The circuit may be incorporated on-chip and is small enough to be integrated many times across the surface of the die for measuring integrity parameters at several locations on the chip. The circuit instantaneously measures, e.g., the rail voltage of a power supply, which may be fluctuating at the time of measurement. In addition, the circuit isolates itself from all chip power rails for the duration of the measurement, thereby eliminating any influence of external noise on the measurement. A storage capacitor is charged up to full power rail voltage for powering up a comparator. Then, the comparator is isolated from the power rails and the measurements are taken. Based upon the measurements, certain power supply integrity parameters are quantified including ground bounce and power droop.

44 Claims, 4 Drawing Sheets

CIRCUIT FOR MEASURING ON-CHIP POWER SUPPLY INTEGRITY

This application is a divisional of application Ser. No. 09/808,140, filed Mar. 15, 2001, which claims priority from British Application No. 0106296.7, filed Mar. 14, 2001, the entire disclosures of which are incorporated herein by reference.

BACKGROUND OF THE INVENTION

1. Field of the Invention

The present invention relates to integrated circuits. More specifically, it relates to a circuit for measuring power integrity of a chip containing integrated circuits.

2. Description of Prior Art

As greater numbers of components are integrated onto semiconductor chips, the quality of the power supplies on those chips becomes an issue for chip designers. A poorly designed power supply architecture can lead to devices failing in operation due to problems such as, e.g., ground bounce and power droop.

Ground bounce is a transient parasitic phenomenon that occurs in high-speed devices and is caused in part by device packaging. When several I/O pins are switched simultaneously at high slew rates (which is, of course, common when driving a bus), the sum of the driving currents through each I/O pin can be quite substantial. The problem arises because this large current must be returned through the ground pins on the device. When there are many fewer ground pins than driving I/O pins, each ground pin is conducting a large portion of the return current. This current can become large enough to induce a significant voltage across the ground pins' lead inductances. This raises the ground reference voltage, which leads to decreased noise margins at receiving modules. Lowered noise margins can result in logic values being sensed improperly, a fatal communications error.

Power droop is experienced when large numbers of logic elements switch at the same time (for example, when the main system dock switches) in that they all draw current from the power supply. Since the wires that connect the circuits to the power supply are not ideal and have resistance, capacitance and inductance, a sudden demand for current will lead to a voltage drop across these wires. The inductance of the wire causes a voltage loss related to the rate of change of current demand. A clock switching causing a sudden large current demand causes a sudden voltage drop to occur across the power supply lines on the chip. Thus, each element that is trying to switch sees an apparent drop in it's supply voltage; this is commonly referred to as "power droop."

To compound this problem, the failures are likely to be caused by dynamic effects and may not be detectable at final test which is usually performed at a much lower frequency than the typical operating frequency of the device.

During the design phase, power analysis programs can be used to evaluate the power consumption of the chip. These programs can be used to verify the power droop through different branches of the power supply network and show "hot spots" where the conductors may be too narrow for the predicted current flow. Unfortunately, these tools are only as good as the models they use and, to improve their speed of operation, the models use a simplified view of the operating environment. This simplification leads to a reduction in accuracy of the results which is sometimes unacceptable. Furthermore, these tools do not consider packaging and board level details, both of which can have significant effects on the power supply quality.

In addition to power analysis programs, there are currently two ways of measuring the voltages in a wire of an operating integrated circuit: directly with a microprobe or indirectly with something like an electron microscope. The indirect methods tend to suffer from the fact that they cannot resolve very fast edge rates and are very expensive. The direct method is reasonably cheap and can cope with moderate edge rates. Unfortunately, it is very time consuming, hard to automate and wastes die area with probe pad landing sites. It also suffers from the problem that performing the measurement disturbs the circuit that is being measured. It is, thus, desirable to have a method of measuring on-chip power supplies of real working silicon at real working frequencies.

SUMMARY OF THE INVENTION

The present invention provides a circuit and method for measuring power supply integrity. The circuit may be incorporated on-chip and, in fact, the circuit is small enough to be integrated many times across the surface of the die. The circuit instantaneously measures, e.g., the voltage of a power supply, which may be fluctuating at the time of measurement. In addition, the circuit isolates itself from all chip power rails for the duration of the measurement, thereby eliminating any influence of external noise on the measurement. A storage capacitor is charged up to full power rail voltage for powering up a comparator. Then, the comparator is isolated from the power rails and the measurements are taken. Based upon the measurements, certain power supply integrity parameters are quantified including ground bounce and power droop.

BRIEF DESCRIPTION OF THE DRAWINGS

The foregoing and other advantages and features of the invention will become more apparent from the detailed description of preferred embodiments of the invention given below with reference to the accompanying drawings in which.

DETAILED DESCRIPTION OF PREFERRED EMBODIMENTS

The present invention will be described as set forth in exemplary embodiments described below in connection with FIGS. 1–6. Other embodiments may be realized and other changes may be made to the disclosed embodiments without departing from the spirit or scope of the present invention.

Figure 1:
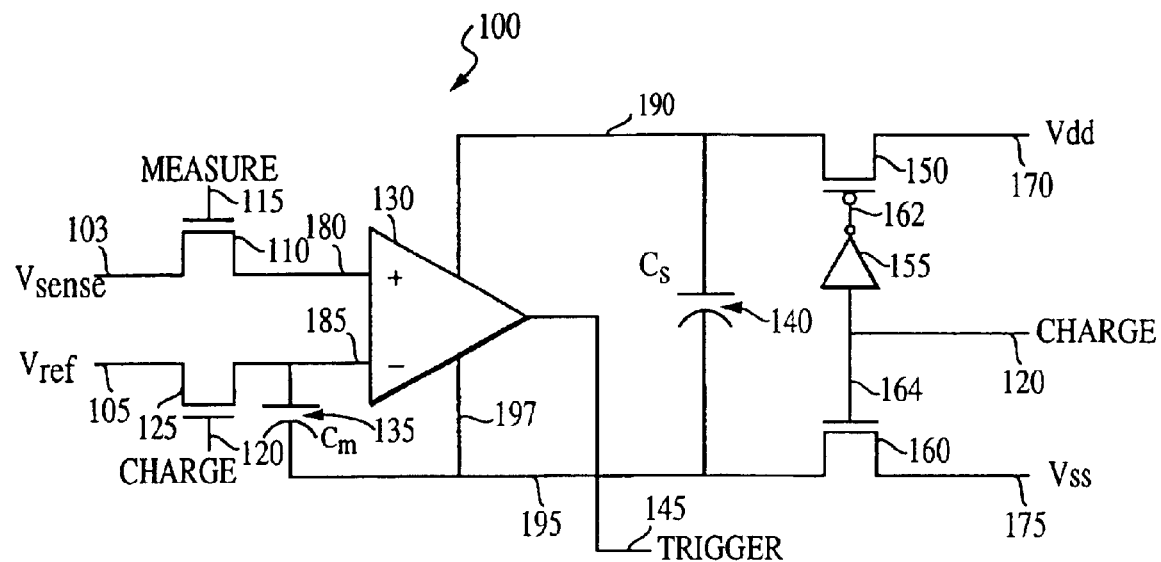
FIG. 1 depicts a schematic diagram of a test circuit in accordance with an exemplary embodiment of the invention.

Referring now to FIG. 1, a test circuit 100 is depicted in accordance with an exemplary embodiment of the invention. In a preferred embodiment (and for purposes of this description), circuit 100 is integrated on a semiconductor chip (or die) for measuring at least one circuit parameter of a circuit under test on the semiconductor die; however, this is not a requirement for practicing the invention. Test circuit 100 includes a comparator 130 having a first input 185 ("−") coupled to a first side of capacitor 135. Input 185 is also coupled to a first terminal of transistor 125. A second terminal of transistor 125 receives a reference voltage (Vref) at position 105. Reference voltage (Vref) may be supplied by some external source (e.g., an analysis program operating the test circuit 100) or may be supplied from the die 300. The gate terminal 120 of transistor 125 is coupled to a Charge input for receiving a charge signal instructing the test circuit 100 to charge as will be described below.

A second input 180 ("+") of comparator 130 is coupled to a first terminal of transistor 110. A second terminal of transistor 110 receives a sense voltage (Vsense) input at point 103 representing a voltage being sensed by the test circuit 100. Point 103 may be permanently coupled to a portion of a circuit under test of the semiconductor die. Transistor 110 will place point 103 in direct electrical contact with the second input 180 of comparator 130. The gate terminal 115 of transistor 110 is coupled to a Measure input for receiving a measure signal instructing the circuit 100 to measure, thereby placing point 103 in electrical contact with comparator 130. An output 145 of comparator 130 produces a Trigger signal, as will be described below.

Comparator 130 is also coupled to a first power terminal 170 (Vdd) and a second power terminal 175 (Vss) via respective transistors 150 and 160. A first terminal of transistor 150 is coupled to comparator 130 via conductor 190. A second input of transistor 150 is coupled to terminal 170 (Vdd). A first terminal of transistor 160 is coupled to comparator 130 via conductors 195 and 197 and also coupled to a second side of capacitor 135 (Cm). A second terminal of transistor 160 is coupled to terminal 175 (Vss). The gate terminal 162 of transistor 150 is coupled to an output of inverter 155. The gate terminal 164 of transistor 160 is coupled to an input of inverter 155. A Charge input 120 is also coupled to both gate terminal 164 and the input to inverter 155. In addition, a first side of capacitor 140 (Cs) is coupled to conductor 190 and a second side of capacitor 140 (Cs) is coupled to conductor 195.

Figure 2:
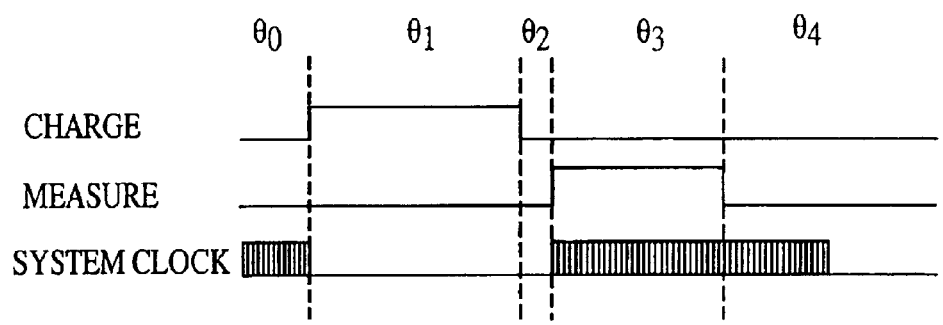
FIG. 2 depicts a timing diagram for the operation of the FIG. 1 test circuit, in accordance with an exemplary embodiment of the invention.

The operation of the FIG. 1 circuit will now be described in connection with FIG. 2. FIG. 2 depicts a timing diagram for the operation of the FIG. 1 integrity analysis circuit 100. During the first phase ($\theta_0$), both Charge and Measure are at logic LOW (e.g., 0). This is the normal operating mode of the semiconductor chip or die (300 of FIG. 3) upon which the test circuit 100 is integrated. As depicted in FIG. 2, during the first phase ($\theta_0$), the system clock (315 of FIG. 3) operates under normal conditions and the test circuit 100 is not activated.

During the second phase ($\theta_1$), the system clock (315 of FIG. 3) is stopped, the Charge signal toggles to logic HIGH (e.g., 1) and the Measure signal remains logic LOW (e.g., 0). When Charge toggles to logic HIGH, transistors 150 and 160 turn on and allow capacitor 140 (Cs) to charge to the full rail values (Vdd, Vss). In addition, when Charge is logic HIGH, transistor 125 turns on and allows capacitor 135 (Cm) to charge to the fill reference voltage (Vref). The system clock 315 is stopped during $\theta_1$ so that the power supplies can settle to allow the capacitors 140 (Cs) and 135 (Cm) to charge without any noise which tends to change the respective charge values.

During the third phase ($\theta_2$), the Charge signal is made logic LOW (e.g., 0) and the test circuit 100 is effectively disconnected from the system power supplies and the reference voltage source (i.e., Vdd, Vss, Vref) and the semiconductor die 300.

During the fourth phase ($\theta_3$), the system clock 315 returns to normal operation, the Measure signal goes logic HIGH and the comparator's 130 non-inverting input 180 is electrically connected to the circuit under test. For example, input 180 may be coupled to a ground connection if the test circuit 100 is measuring ground bounce, or a power rail, such as Vdd, if the test circuit 100 is measuring power droop, etc. The measurement takes place while the comparator 130 is powered by the discharging capacitor 140 (Cs) rather than the noisy power rails (i.e., Vdd, Vss) and also while the reference voltage (Vref) is supplied by capacitor 135 rather than some source external to the test circuit 100. Furthermore, since the circuit under test is operating under normal conditions, the test circuit 100, when Measure is logic HIGH, senses the voltage of interest under so-called fill load conditions in which the operating frequency is running at its fill value and the conductors on the die 300 are carrying their intended current values. It should be noted that in order to achieve satisfactory isolation of the test circuit 100 from substrate noise, layout of the test circuit(s) 100 on the die 300 must be carefully undertaken as well as the possibility that guard rings might need to be provisioned. Guard rings, as known in the art, are structures that form an electrical barrier around a designated area such that any electrical noise travelling in the substrate of the chip is absorbed by the guard ring and conducted away from the protected region (i.e., the test circuit 100).

During the fifth phase ($\theta_4$), the Measure signal goes logic LOW and the measure operation is ended. The system clock 315 still operates under normal conditions and Charge is still logic LOW.

During operation of the test circuit 100, if the sensed voltage (Vsense) is greater than the reference voltage (Vref), the comparator 130 outputs, e.g., a logic HIGH (e.g., 1) signal onto Trigger 145 which may then be forwarded to an external test program which then increments the reference voltage (Vref) a predetermined amount in preparation for the next analysis cycle (phases 1–5). In accordance with an exemplary embodiment of the invention, for each analysis cycle (i.e., where each analysis cycle comprises phases 1–5), the reference voltage (Vref) is incrementally increased from 0v to Vdd. When measuring for ground bounce, the voltage of a selected ground terminal is sensed and compared with the new value of Vref. Eventually, as Vref is incremented for each test cycle, Vsense will be less than Vref and the Trigger output will stop toggling to logic HIGH (e.g. 1). At this point, the maximum ground bounce is known (i.e., it will be very close to the last incremental value of Vref) and appropriate adjustments can be made on a receiving end of a signal (e.g., via an external analysis program working in tandem with the test circuit 100).

Conversely, when the test circuit 100 is configured to test for power droop, the inverting input 185 and the non-inverting input 180 of the comparator 135 are switched, thereby allowing the detection of a condition in which Vsense falls below Vref as Vref is incrementally inversed from 0V to Vdd. The reference voltage (Vref) can be fed to many instances of the test circuit 100 throughout the die 300, as will be described below.

Figure 3:
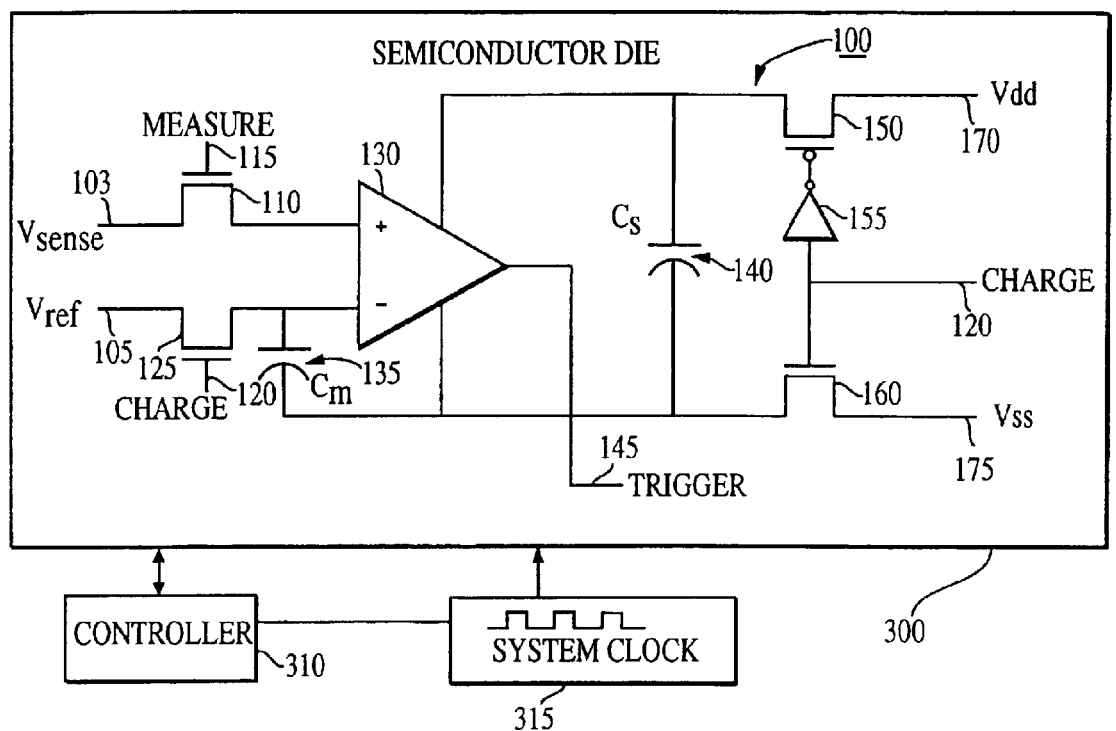
FIG. 3 depicts the FIG. 1 test circuit on a semiconductor die, in accordance with an exemplary embodiment of the invention.

Turning now to FIG. 3, the test circuit 100 of FIG. 1 is depicted as being integrated on a semiconductor die 300.

The test circuit 100 operates in the same manner as described for FIGS. 1 and 2. The Trigger 145 output may be forwarded to the external test program via a chip pin or possibly via a test scan chain. A test scan chain, as known in the art, is a set of interconnected storage elements commonly used for device test. The Trigger signal would step from storage element to storage element until it reaches an external chip pin. The test scan chain technique is used to reduce the number of pins required to view internal signals. In addition, a system clock 315 is coupled to the semiconductor die 300 for controlling operation of the components of at least one circuit under test which is also integrated on die 300. In addition, a controller 310 is coupled to the semiconductor die 300 for controlling the operation of the test circuit 100 and system clock 315.

Figure 4:
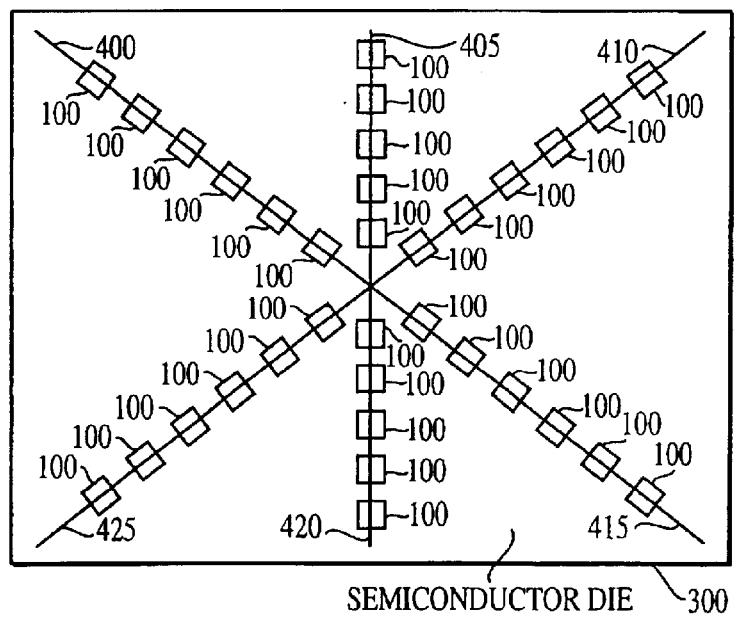
FIG. 4 depicts a plurality of test circuits on a semiconductor die, in accordance with an exemplary embodiment of the invention.

Turning to FIG. 4, a plurality of test circuits 100 is depicted as being integrated on a semiconductor die 300, in accordance with an exemplary embodiment of the invention. Six rows of test circuits 100 are positioned across the die 300 so that virtually all portions of the die may be analyzed simultaneously. In accordance with an exemplary embodiment, the reference voltage (Vref) is transmitted simultaneously to all test circuits 100 via conductors 400–425 so that each test circuit 100 can compare Vref with a sensed voltage (Vsense) in order to measure either voltage droop or ground bounce as predetermined by the circuit designer.

Figure 5:
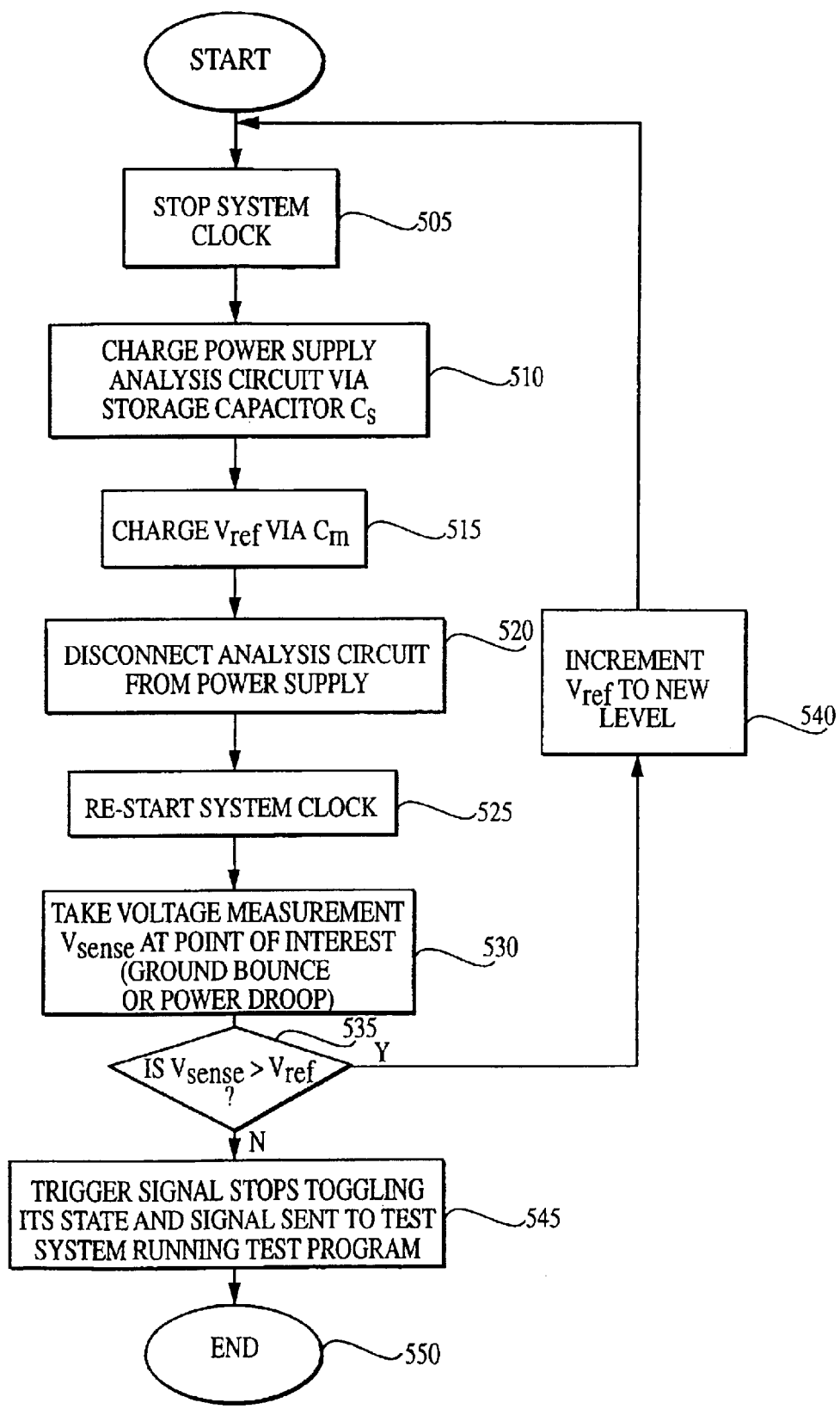
FIG. 5 shows a flowchart depicting an operational flow of the FIG. 1 test circuit, in accordance with an exemplary embodiment of the invention.

Turing now to FIG. 5, a flowchart describing an operation flow of the test circuit 100 is depicted. The flowchart depicts the sensing of a ground potential for determining maximum ground bounce; however, as was described above in connection with FIGS. 1 and 2, the test circuit 100 is easily modified for sensing power droop. The FIG. 5 flowchart begins at segment 500. At segment 505, the controller 310 stops the system clock 315. At segment 510, the test circuit 100 is charged up to the full rail voltage Vdd via capacitor 140 (Cs). At segment 515, the reference voltage (Vref) is stored on capacitor 135 (Cm). At segment 520, test circuit 100 is disconnected from the power supply terminals (Vdd, Vss) before the system clock 315 is restarted. At segment 525, the system clock 315 is restarted. At segment 530, the Measure signal goes logic HIGH and comparator 130 receives the sensed voltage (Vsense) at non-inverting input terminal 180 where it is compared with Vref. In accordance with an exemplary embodiment of the invention, the measurement and comparison occurs during normal operation of the circuit under test on semiconductor die 300, thus providing the designer with an accurate composite of certain fluctuating values (e.g., ground bounce and power droop).

At segment 535, the controller 310 determines whether Vsense is greater than Vref. If it is, the Trigger signal on comparator output terminal 145 is sent to a test program which increments the value of Vref at segment 540 and the process returns to segment 505 where segments 505–535 are repeated. However, if Vsense is less than Vref at segment 535, the Trigger signal does not toggle and may be forwarded to an external test system, at segment 545, where a determination of either maximum ground bounce or power droop is made. Such data may be used by the test system e.g., in optimizing the physical layout of the die 300. For example, if ground bounce is determined to be too high, additional ground pins may be added to the die 300 so as to reduce the current conducted by each individual ground pin. Alternatively, if power droop is found to be unacceptable, the designer may choose to increase the current carrying capacity of certain conductors on the die 300. It should be readily apparent that the exact order of process segments depicted in FIG. 5 need not be followed in order to practice the invention. For example, process segments 510 and 515 need not occur in any particular order and may, in fact, occur simultaneously.

Figure 6:
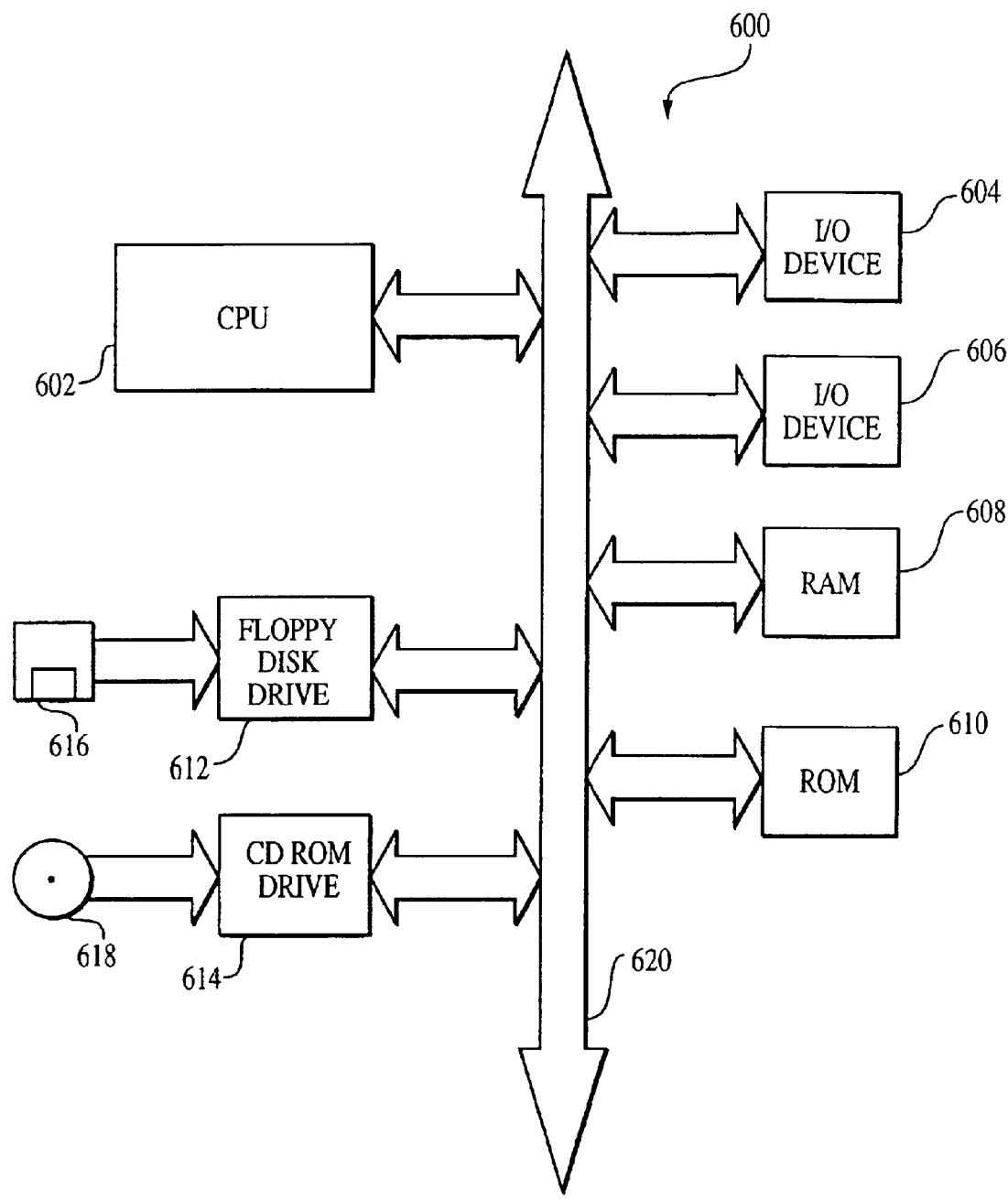
FIG. 6 depicts a processor-based system for carrying out the FIG. 5 operational flow, in accordance with an exemplary embodiment of the invention.

FIG. 6 illustrates a block diagram of a processor-based system 600 configured to run a software program for operating a test circuit 100 in a manner consistent with the process flow described in FIG. 5. For example, the process described in FIG. 5 may be part of a software program stored on a computer readable medium (e.g., floppy disk 616, compact disk (CD) 618, etc.) which, when read by the system 600, operates the system to carry out the FIG. 5 process in accordance with an exemplary embodiment of the invention. The processor-based system 600 may be a computer system or any other processor system. The system 600 includes a central processing unit (CPU) 602, e.g., a microprocessor, that communicates with floppy disk drive 612 and CD ROM drive 614 over a bus 620. It must be noted that the bus 620 may be a series of buses and bridges commonly used in a processor-based system, but for convenience purposes only, the bus 620 has been illustrated as a single bus. An input/output (I/O) device (e.g., monitor) 604, 606 may also be connected to the bus 620 for practicing the invention. The processor-based system 600 also includes a read-only memory (ROM) 610 which may also be used to store the software program.

Although the FIG. 6 block diagram depicts only one CPU 602, the FIG. 6 system could also be configured as a parallel processor machine for performing parallel processing. As known in the art, parallel processor machines can be classified as single instruction/multiple data (SIMD), meaning all processors execute the same instructions at the same time, or multiple instruction/multiple data (MIMD), meaning each processor executes different instructions. In accordance with an exemplary embodiment of the invention, at least one of the parallel processors is coupled to a bus (e.g., 620) for receiving instructions from a software program consistent with that described in connection with FIG. 5.

The present invention provides a test circuit 100 and corresponding method for measuring power supply integrity. The test circuit 100 is so small and simple it may be integrated many times on a semiconductor die 300. The test circuit 100 may be configured to quantify important power supply parameters such as, e.g., ground bounce and power droop. In addition, when the test circuit 100 is integrated on the die 300, the test circuit 100 takes measurements during normal operation of the circuit or circuits under test on the die 300. Taking such measurements during normal operation allows the designer to assess the overall integrity of the circuits under test on the die 300. For example, the designer may discover that more ground pins are required or that certain conductors on the die 300 must be enlarged in order to carry the amount of current expected during normal operation.

While the invention has been described in detail in connection with preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. For example, although the invention has been described in connection with specific electronic components, the invention may be carried out with any number of different components. In addition, while the invention depicts a separate controller 310 as being coupled to the semiconductor die 300, it should be readily apparent that a controller may be incorporated onto the die 300 itself or the CPU 602 (of FIG. 6) may serve as the controller 310 for operating the test circuit 100. Furthermore, while the invention has been described with Vref incrementally increasing from 0V to Vdd, Vref may begin and end at any voltage. Moreover, Vref need not be the same for each test circuit 100 on the die 300, but rather, multiple conductors carrying multiple values of Vref may be integrated on the die 300. Accordingly, the invention is not limited by the foregoing description or drawings, but is only limited by the scope of the appended claims.

What is claimed is:

1. A computer readable storage medium storing a computer readable program for measuring a parameter of a circuit under test, said computer readable program being configured to operate a computer to:
   (a) charge a first portion of a test circuit up to a first voltage level;
   (b) charge a second portion of said test circuit up to a second voltage level;
   (c) disconnect said test circuit from respective voltage terminals providing said first and second voltage levels; and
   (d) measure said parameter of said circuit under test with said test circuit.

2. The storage medium of claim 1, wherein said program is further configured to operate said computer to charge a first capacitor of said test circuit to a power rail voltage level, and also to charge a second portion comprises charging a second capacitor of said test circuit to a predetermined reference voltage level.

3. The storage medium of claim 2, wherein said program is further configured to operate said computer to charge said first capacitor to Vdd.

4. The storage medium of claim 2, wherein said program is further configured to operate said computer to charge said second capacitor to an initial reference voltage level.

5. The storage medium of claim 2, wherein said program is further configured to operate said computer to:
   change said predetermined reference voltage level; and
   repeat acts (a) through (d) if said measured parameter does not have a predetermined relationship with said predetermined reference voltage level.

6. The storage medium of claim 5, wherein said program is further configured to operate said computer to change said reference voltage level from an initial reference voltage level.

7. The storage medium of claim 5, wherein said program is further configured to operate said computer to repeat acts (a) through (d) if a measured voltage is not less than said predetermined reference voltage level.

8. The storage medium of claim 7, wherein said program is further configured to operate said computer to repeat acts (a) through (d) if a voltage measured at a ground terminal is not less than said predetermined reference voltage level.

9. The storage medium of claim 5, wherein said program is further configured to operate said computer to repeat acts (a) through (d) if a measured voltage is not less than said predetermined reference voltage level.

10. The storage medium of claim 9, wherein said program is further configured to operate said computer to repeat acts (a) through (d) if a voltage measured at a power rail of said circuit under test is not less than said predetermined reference voltage level.

11. The storage medium of claim 1, wherein said program is further configured to operate said computer to disconnect said test circuit from a power rail of said circuit under test.

12. The storage medium of claim 11, wherein said program is further configured to operate said computer to disconnect said test circuit from a Vdd terminal.

13. The storage medium of claim 12, wherein said program is further configured to operate said computer to toggle a state of a transistor coupled between said test circuit and said Vdd terminal.

14. The storage medium of claim 11, wherein said program is further configured to operate said computer to disconnect said test circuit from a reference voltage terminal.

15. The storage medium of claim 14, wherein said program is further configured to operate said computer to toggle a state of a transistor coupled between said test circuit and said reference voltage terminal.

16. The storage medium of claim 1, wherein said program is further configured to operate said computer to compare a sensed voltage with a reference voltage.

17. The storage medium of claim 16, wherein said program is further configured to operate said computer to compare a voltage sensed at a ground terminal of said circuit under test with a reference voltage.

18. The storage medium of claim 17, wherein said program is further configured to operate said computer to toggle a state of a transistor coupled between the test circuit and said ground terminal being sensed.

19. The storage medium of claim 16, wherein said program is further configured to operate said computer to compare a voltage sensed at a power rail of said circuit under test with a reference voltage.

20. The storage medium of claim 19, wherein said program is further configured to operate said computer to toggle a state of a transistor coupled between the test circuit and said power rail being sensed.

21. The storage medium of claim 1, wherein said program is further configured to operate said computer to quantify ground bounce for said circuit under test.

22. The storage medium of claim 1, wherein said program is further configured to operate said computer to quantify power droop of said circuit under test.

23. A processor system, comprising:
   a processor; and
   a communications link coupled to said processor and also coupled to a computer readable storage medium, wherein
   said computer readable storage medium stores a computer program for measuring a parameter of a circuit under test, said computer program configured to operate said processor to:
   (a) charge a first portion of a test circuit up to a first voltage level:
   (b) charge a second portion of said test circuit up to a second voltage level;
   (c) disconnect said test circuit from respective voltage terminals providing said first and second voltage levels; and
   (d) measure said parameter of said circuit under test with said test circuit.

24. The processor system of claim 23, wherein said program is further configured to operate said processor to charge a first capacitor of said test circuit to a power rail voltage level, and also to charge a second capacitor of said test circuit to a predetermined reference voltage level.

25. The processor system of claim 24, wherein said program is further configured to operate said processor to charge said first capacitor to Vdd.

26. The processor system of claim 24, wherein said program is further configured to operate said processor to charge said second capacitor to an initial reference voltage level.

27. The processor system of claim 24, wherein said program is further configured to operate said processor to:
change said predetermined reference voltage level; and
repeat acts (a) through (d) if said measured parameter does not have a predetermined relationship with said predetermined reference voltage level.

28. The processor system of claim 27, wherein said program is further configured to operate said processor to change said reference voltage level from an initial reference voltage level.

29. The processor system of claim 27, wherein said program is further configured to operate said processor to repeat acts (a) through (d) if a measured voltage is not less than said predetermined reference voltage level.

30. The processor system of claim 29, wherein said program is further configured to operate said processor to repeat acts (a) through (d) if a voltage measured at a ground terminal is not less than said predetermined reference voltage level.

31. The processor system of claim 27, wherein said program is further configured to operate said processor to repeat acts (a) through (d) if a measured voltage is not less than said predetermined reference voltage level.

32. The processor system of claim 31, wherein said program is further configured to operate said processor to repeat acts (a) through (d) if a voltage measured at a power rail of said circuit under test is not less than said predetermined reference voltage level.

33. The processor system of claim 23, wherein said program is further configured to operate said processor to disconnect said test circuit from a power rail of said circuit under test.

34. The processor system of claim 33, wherein said program is further configured to operate said processor to disconnect said test circuit from a Vdd terminal.

35. The processor system of claim 34, wherein said program is further configured to operate said processor to toggle a state of a transistor coupled between said test circuit and said Vdd terminal.

36. The processor system of claim 33, wherein said program is further configured to operate said processor to disconnect said test circuit from a reference voltage terminal.

37. The processor system of claim 36, wherein said program is further configured to operate said processor to toggle a state of a transistor coupled between said test circuit and said reference voltage terminal.

38. The processor system of claim 23, wherein said program is further configured to operate said processor to compare a sensed voltage with a reference voltage.

39. The processor system of claim 38, wherein said program is further configured to operate said processor to compare a voltage sensed at a ground terminal of said circuit under test with a reference voltage.

40. The processor system of claim 39, wherein said program is further configured to operate said processor to toggle a state of a transistor coupled between the test circuit and said ground terminal being sensed.

41. The processor system of claim 38, wherein said program is further configured to operate said processor to compare a voltage sensed at a power rail of said circuit under test with a reference voltage.

42. The processor system of claim 41, wherein said program is further configured to operate said processor to toggle a state of a transistor coupled between the test circuit and said power rail being sensed.

43. The processor system of claim 23, wherein said program is further configured to operate said processor to quantify ground bounce for said circuit under test.

44. The processor system of claim 23, wherein said program is further configured to operate said processor to quantify power droop of said circuit under test.

* * * * *